(12) United States Patent  (10) Patent No.: US 7,701,755 B2
Chen et al.  (45) Date of Patent: Apr. 20, 2010

(54) MEMORY HAVING IMPROVED POWER DESIGN

(75) Inventors: Yen-Huei Chen, Hsinchu Science Park Hsinchu (TW); Hung-Jen Liao, Hsin-Chu (TW); Kun-Lung Chen, Taipei (TW); Yung-Lung Lin, Taichung (TW); Dao-Ping Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 470 days.

(21) Appl. No.: 11/619,103

(22) Filed: Jan. 2, 2007

(65) Prior Publication Data

US 2008/0158939 A1  Jul. 3, 2008

(51) Int. Cl.
*G11C 11/00* (2006.01)

(52) U.S. Cl. .................. 365/154; 365/156; 365/189.09; 365/226

(58) Field of Classification Search .................. 365/154, 365/226, 227, 228, 189.14, 189.15, 189.02, 365/189.16, 189.04, 230.02, 189.09, 156
See application file for complete search history.

(56) References Cited

U.S. PATENT DOCUMENTS

| | | | | |
|---|---|---|---|---|
| 5,715,191 | A * | 2/1998 | Yamauchi et al. | 365/156 |
| 5,757,702 | A * | 5/1998 | Iwata et al. | 365/189.05 |
| 6,532,167 | B2 * | 3/2003 | Kaneko et al. | 365/149 |
| 6,970,374 | B2 | 11/2005 | Lin | |
| 6,985,380 | B2 | 1/2006 | Khellah et al. | |
| 7,020,041 | B2 | 3/2006 | Somasekhar et al. | |
| 7,079,426 | B2 | 7/2006 | Zhang et al. | |
| 2002/0024873 | A1 * | 2/2002 | Tomishima et al. | 365/230.06 |

OTHER PUBLICATIONS

Zhang et al., "A 3-GHz 70-Mb SRAM In 65nm CMOS Technology with Integrated Column-Based Dynamic Power Supply", 2005 IEEE International Solid-State Circuits Conference, 3 pages.

Zhang et al., "A 3-GHz 70-Mb SRAM in 65-nm CMOS Technology With Integrated Column-Based Dynamic Power Supply", IEEE Journal of Solid-State Circuits, vol. 41, No. 1, Jan. 2006, pp. 146-151.

Yamauchi et al., "A 0.5 V Single Power Supply Operated High-Speed Boosted and Offset-Grounded Data Storage (BOGS) SRAM Cell Architecture," IEEE Transactions On Very Large Scale Integration (VLSI) Systems, vol. 5, No. 4, Dec. 1997, pp. 377-387.

(Continued)

*Primary Examiner*—Pho M Luu
*Assistant Examiner*—Tha-o Bui
(74) *Attorney, Agent, or Firm*—Duane Morris LLP

(57) ABSTRACT

A memory includes a plurality of cells arranged in a matrix having a plurality of rows and a plurality of columns, wherein each cell is capable of storing a bit. Each cell is coupled between a first power supply node that receives a power supply voltage and a second power supply node that receives a second voltage. A plurality of word lines are associated with the memory cells and supplied by a third voltage in read or write operation. The third voltage is a suppressed power supply voltage. The second voltage is negative in read operation and positive in write operation.

13 Claims, 10 Drawing Sheets

OTHER PUBLICATIONS

Shibata et al., A 0.5- V 25-MHz 1-mW 256-Kb MTCMOS/SOI SRAM for Solar-Power-Operated Portable Personal Digital Equipment—Sure Write Operation by Using Step-Down Negatively Overdriven Bitline Scheme, IEEE Journal of Solid-State Circuits, vol. 41, No. 3, Mar. 2006, pp. 728-742.

Yamaoka et al., 0.4-V Logic-Library-Friendly SRAM Array Using Rectangular-Diffusion Cel and Delta-Boosted-Array Voltage Scheme, IEEE Journal Of Solid-State Circuits, Vo. 39, No. 6, Jun. 2004, pp. 934-940.

* cited by examiner

MEMORY HAVING IMPROVED POWER DESIGN

FIELD OF THE INVENTION

The present invention relates to power designs for memories, and more specifically to power designs for static RAMs (SRAMs).

BACKGROUND OF THE INVENTION

Processor-based systems rely on different kinds of memory devices for data storage. Memory devices include non-volatile kinds, such as read-only memory (ROM), hard disk drives and compact disk (CD) ROM drives, as well as volatile media, known as random access memory (RAM). The RAM is directly accessible by the processor, so data stored on the hard disk drive is loaded into RAM before processing can begin.

A processor-based system, such as a personal computer, may include more than one type of RAM. One such memory is static RAM (SRAM), which stores data in a flip-flop. Because SRAM cells need not be refreshed, they operate at faster speeds than one-transistor dynamic RAM (DRAM) cells. SRAM cells are typically used for level-one and level-two caches within the processor-based system.

High-performance very large scale integration (VLSI) systems employ large amounts of on-die SRAM for the cache function. As scaling of such technologies continues, particular attention is given to the performance of the SRAM as well as its die size. Since the SRAM cell supports both read and write operations, its performance is measured by its read stability and its write margin. "Read stability" may be loosely defined as the probability that during a read operation performed upon a cell, the cell will "flip" its content. Write margin may be loosely defined as how low the bit-line voltage level must be to flip the cell, i.e., to accomplish a successful write.

The read stability and the write margin make conflicting demands on the SRAM cell. During a read operation, the SRAM cell preferably has "weak disturbance" at the internal storage nodes in order to avoid being erroneously flipped (from a "1" state to a "0" state, and vice-versa). This is the preference whether a "true read," in which the contents of the cell are sent to read/write circuitry, or a so-called "dummy read," in which the read is not actually processed, takes place. During a write operation, the SRAM cell preferably has "strong disturbance" in order to successfully flip the cell. Thus, read stability depends on weak disturbance within the SRAM cell while write margin depends on strong disturbance within the same SRAM cell.

For the current generation of SRAM memory, cell scaling is limited by both the read and write operations. Thus, there is a continuing need to design an SRAM memory cell that meets both the read stability and the write margin requirements, while a minimum cell area is maintained.

SUMMARY OF THE INVENTION

A memory includes a plurality of cells arranged in a matrix having a plurality of rows and a plurality of columns, wherein each cell is capable of storing a bit. Each cell is coupled between a first power supply node that receives a power supply voltage and a second power supply node that receives a second voltage. A plurality of word lines are associated with the cells and are supplied by a third voltage in read or write operation. The third voltage is a suppressed power supply voltage. The second voltage is negative in read operation and positive in write operation.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
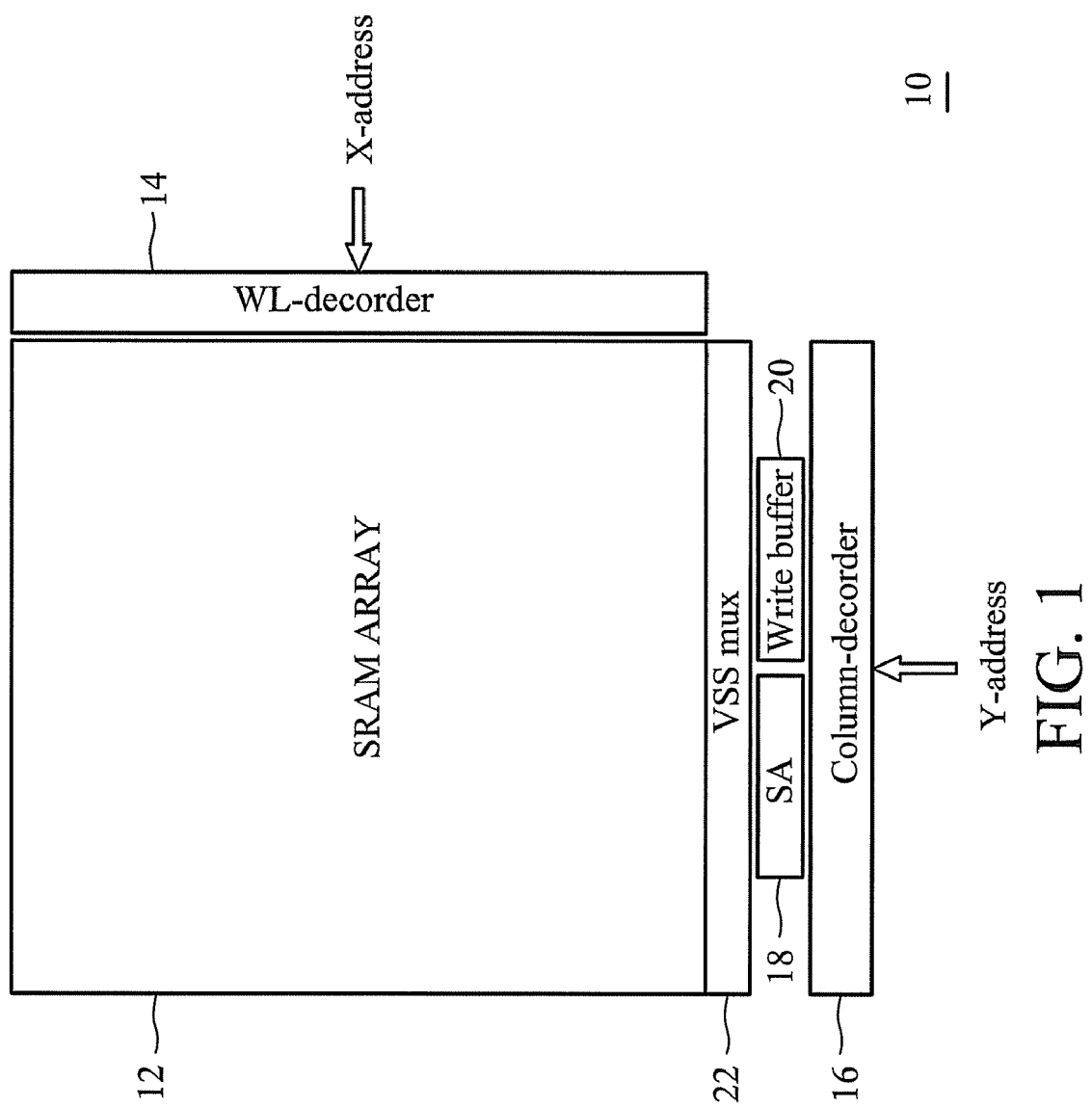
FIG. 1 is a block diagram of an exemplary memory device including an array.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a block diagram of a memory device 10. Memory device 10 includes a SRAM memory array 12, a word line decoder 14, a column decoder 16, sense amplifiers 18 and write buffer 20. The details of these components and others which may be included in the memory device 10 are known to those of ordinary skill in the art and need not be detailed herein. As those in the art will recognize, SRAM memory array 12 includes a plurality of memory cells each capable of storing a bit and arranged in a plurality of rows and columns. Each memory cells is configured as a 6 or 8 transistor memory cell.

In one embodiment, memory device 10 also includes a Vss multiplexer 22 which operates, as described in more detail below, to provide a first Vss voltage or a second Vss voltage to a column of memory cells depending on whether a cell in the column is being read from or written to. In one embodiment, the Vss voltage is negative during reading of the cell and positive during writing of the cell. In this embodiment, the Vss voltage may also be positive when the memory is in standby mode. The Vss multiplexer 22 may also be configured to provide a ground voltage to the Vss node of the unselected columns of cells, i.e., to columns of the memory array that do not include the cell that has been selected for reading or writing operation.

Figure 2:
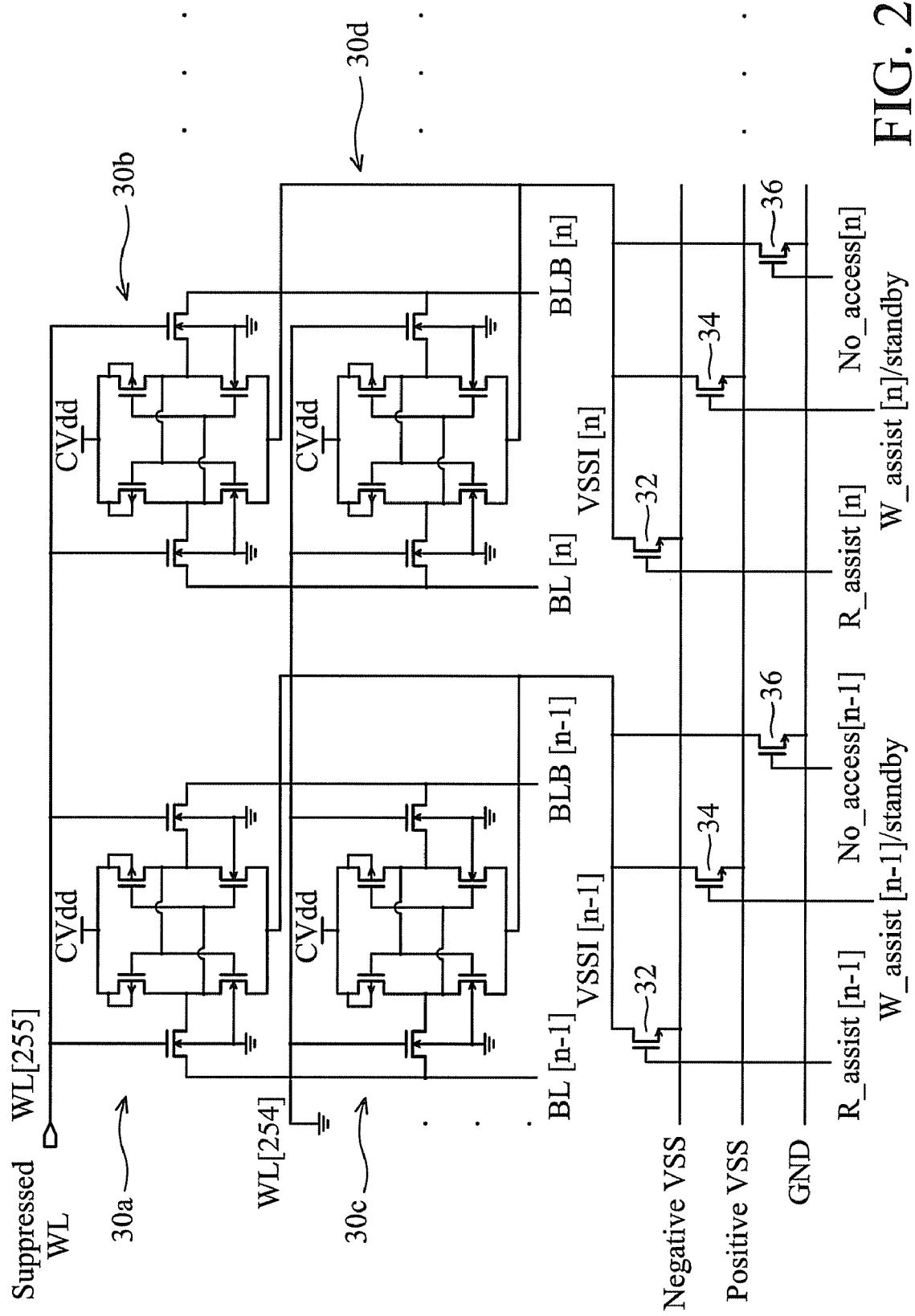
FIG. 2 is a circuit diagram showing four SRAM cells with dynamic Vss biasing.

FIG. 2 is a circuit diagram showing four, six transistor SRAM memory cells 30a to 30d. Though only two rows and two columns are shown, it should be understood that the SRAM memory array typically includes, for example, 512 rows by 256 columns of SRAM cells. The cells of each column share a common Vss node. As can be seen from FIG. 2, the Vss nodes of the memory cells are selectively coupled to either a negative Vss, a positive Vss or ground (GND) depending upon whether the selected cell is to be read from, written to, or not accessed. Application of the negative Vss to the cells of each column is controlled by transistors 32 under control of signal R_assist. Application of the positive Vss to the cells of each column is controlled by transistors 34 under control of signal W_assist/standby. Finally, application of ground to the Vss node of the cells of each column is provided by transistors 36 under control of signal No_access.

In embodiments, the transistors 32, 34, 36 can be arranged as a multiplexer. For example, a first group of transistors 32, 34, 36 associated with a first column of cells forms a first 3:1 multiplexer, a second group of transistors 32, 34, 36 associated with a second column forms a second 3:1 multiplexer, etc. Of course, together these individual multiplexers can be considered an m:n multiplexer where m=3n.

Figure 3:
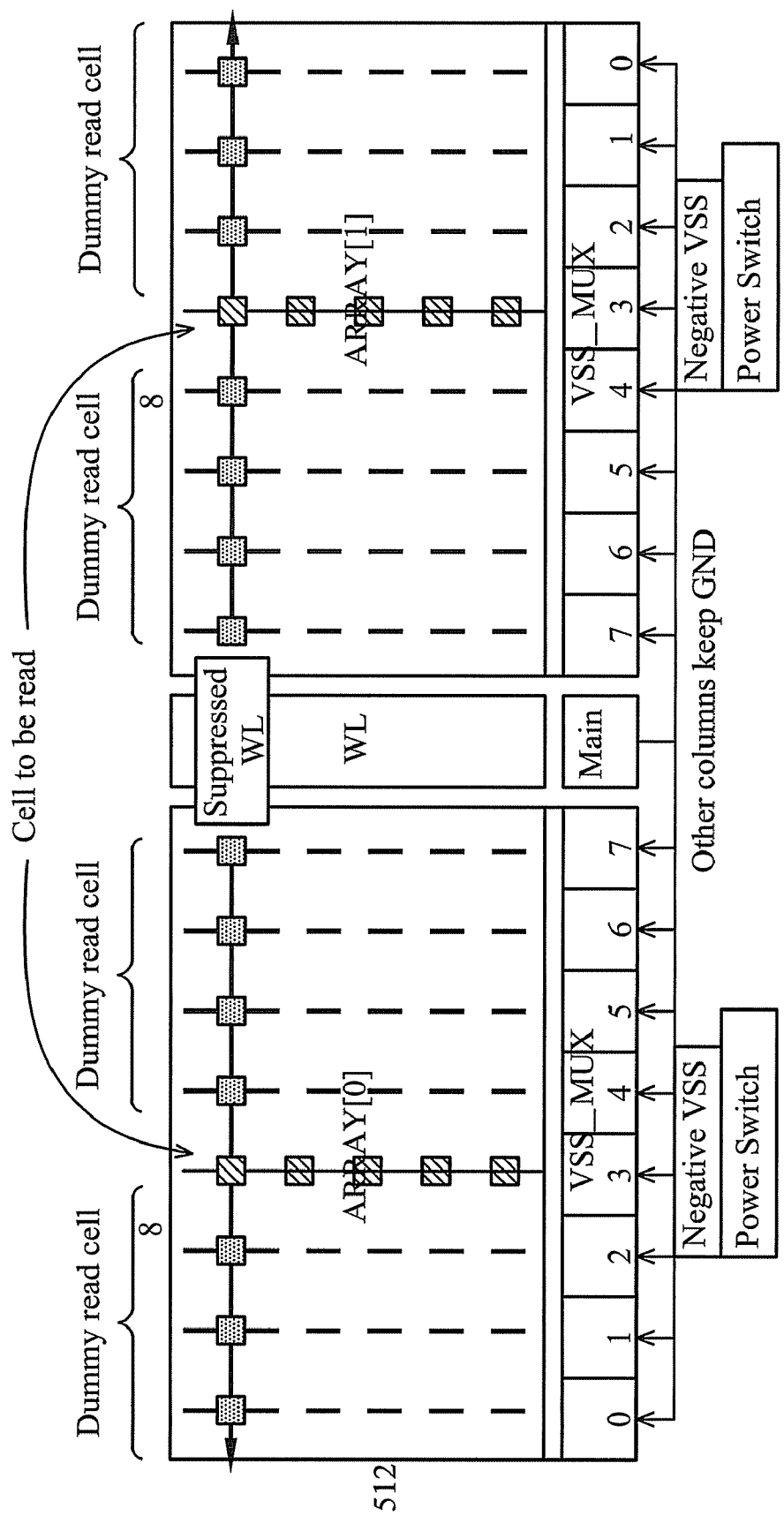
FIG. 3 is a highly schematized view showing the biasing conditions of cells of the SRAM array during the read operation.

FIG. 3 is a highly schematized view illustrating the biasing conditions of columns of cells during a read operation. The cells are shown arranged as two symmetrical 8×512 rays of memory cells, labeled Array[0] and Array [1]. As those skilled in the art will understand, more than one bit is read from a SRAM macro at the same time. For a SRAM having eight I/Os, eight bits are read at the same time. Each I/O contains eight bit lines. So, there are sixty-four (eight times eight) bit lines in this SRAM eight I/O example. Typically, the macro has a symmetrical arrangement of left and right arrays as shown in FIG. 3. So, if there are eight I/O's, each array will contain four I/Os, meaning thirty-two bit lines. During a read/write operation, each I/O will be read out or write to one cell. A multiplexer chooses only one bit line to be "on" per eight bits in a single I/O. For purposes of illustration only and not by way of limitation, FIG. 3 shows two arrays with two I/Os. Each I/O contains eight bits.

A suppressed word line voltage (i.e. a voltage less than device power supply voltage Vdd) is applied to the word line associated with a row of cells containing the cell that is to be read. The cells in the column of the cell that is being read are biased with a negative Vss voltage (e.g., column 3). The remaining cells of the corresponding word line are designated "dummy read cells." All other columns of cells have their Vss nodes grounded. The suppressed word line voltage prevents dummy read cell disturb. As described in more detail below, the column-based negative Vss can compensate for cell current degradation caused by suppressed word-line pulse voltage.

Figure 4:
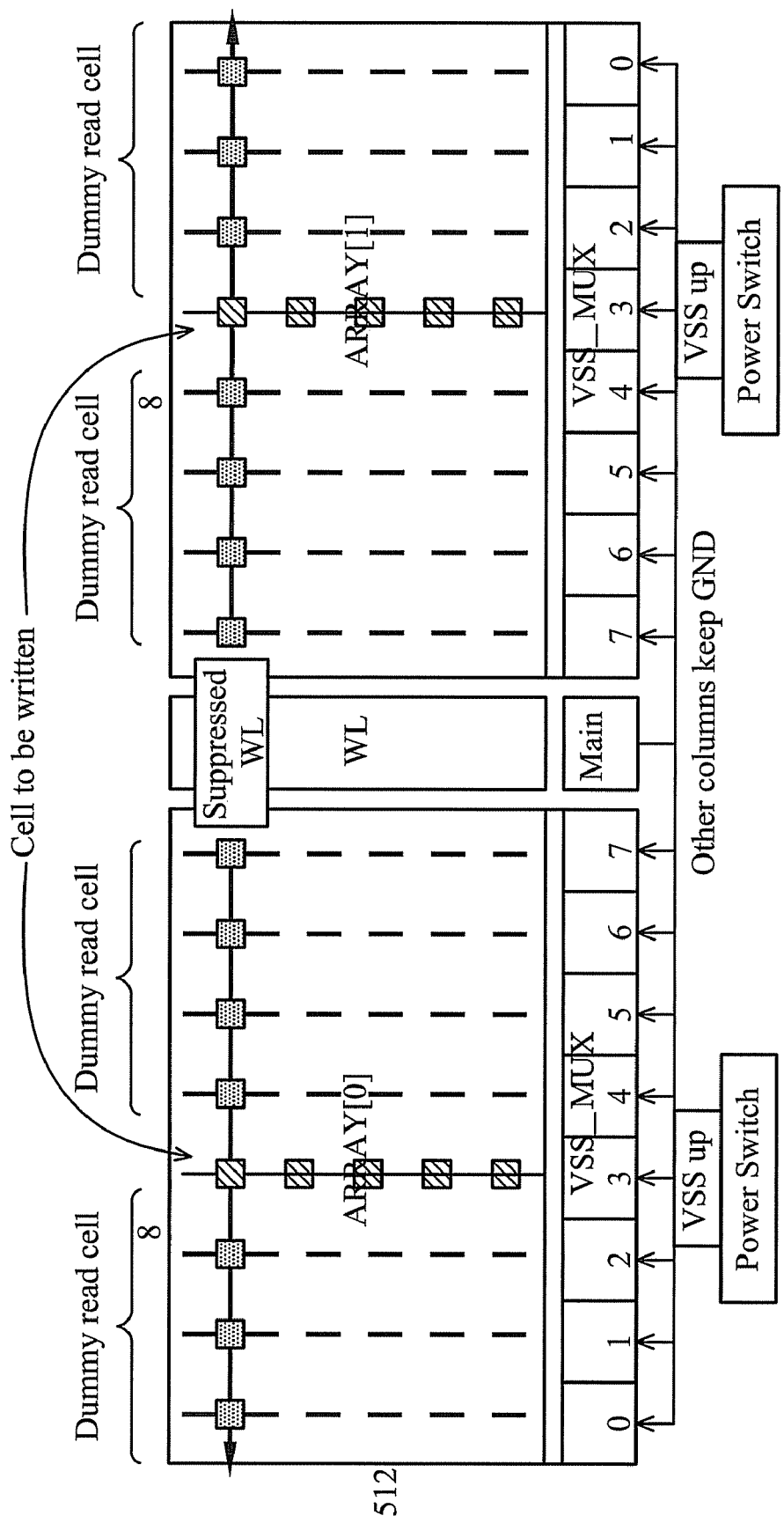
FIG. 4 is a highly schematized view showing the biasing conditions of cells of the SRAM array during write operation.

FIG. 4 is a highly schematized view illustrating the biasing conditions for cells during a write operation. As with the read operation, a suppressed word line voltage is applied to the word line associated with the row of cells containing the cell selected for the write operation. The cells in the column containing the cell that is selected for the write operation are biased with a positive Vss voltage (labeled "Vss Up" in the figure). All other columns of cells have their Vss nodes grounded. As with the read operation, the suppressed word line voltage can avoid dummy cell disturb. For the selected cell, the positive Vss voltage improves the write margin.

Figures 5A, 5B, 5C:
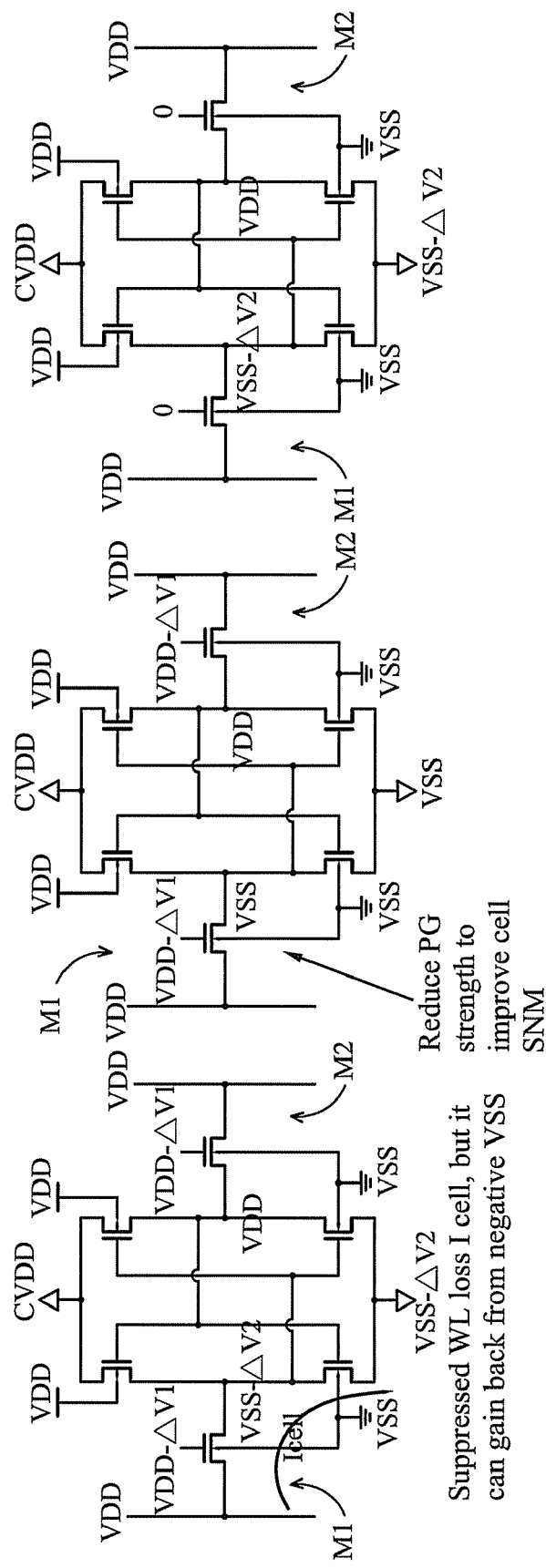
FIGS. 5A-5C show biasing conditions during reading for a selected cell, a dummy cell and an unselected cell.

FIGS. 5A, 5B and 5C show the bias conditions for an individual SRAM six transistor cell when selected for reading (FIG. 5A), when under a dummy read (FIG. 5B) and when unselected (FIG. 5C). The cell is coupled between a Vdd node and a Vss node. The Vss node is dynamically biased depending on whether the cell is being read from or written to. FIG. 5A shows that the word line voltage is lower than Vdd, i.e., suppressed to Vdd−ΔV1. Due to the suppressed voltage on the word line, there is a loss in the cell current (labeled $I_{cell}$). However, because the memory cell of FIG. 5A is selected for reading, the Vss node is set to a negative voltage Vss−ΔV2, which increases the voltage drop from the gate to source (Vgs) of transistor M1 of the SRAM cell by ΔV2, when compared to grounding the Vss terminal as in the prior art. The increased voltage drop (Vgs) helps to increase the cell current $I_{cell}$. The increased current, in turn, improves the read stability of the cell even though the word line voltage is suppressed.

Turning to FIG. 5B, when the cell is a dummy read cell, meaning it is in the same row as the selected cell but not the same column, the Vss node of the cell is biased at ground (or other normal Vss condition) while the word line voltage remains suppressed at Vdd−ΔV1. Since the word line voltage is suppressed, the beta ratio increases to prevent read disturb. Consequently, the cell's read stability is improved.

The bias conditions for an unselected cell (i.e., a cell in the same column as the selected cell but different row) are shown in FIG. 5C. Because the cell is in the same column as the selected cell, the Vss node of the cell is biased at Vss−ΔV2. However, because the cell is in an unselected row, the gate of the transistor M1 is set to 0V, i.e., the word line voltage of an unselected row. Since the word line voltage is 0V, the static noise margin (SNM) of the cell is enough to sustain its data. There are no concerns under these conditions that the cell state will inadvertently "flip."

Figures 6A, 6B, 6C:
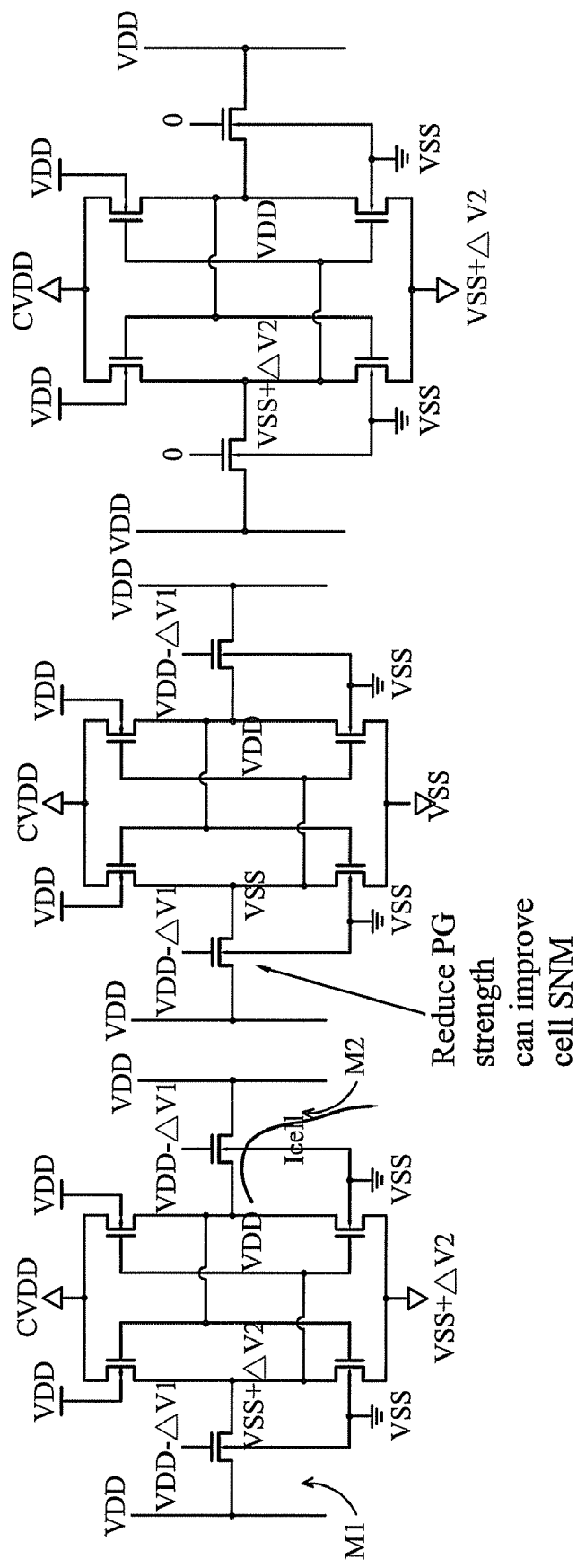
FIGS. 6A-6C show biasing conditions during writing for a selected cell, a dummy cell and an unselected cell.

FIGS. 6A, 6B and 6C show the bias conditions for an individual SRAM six transistor cell when selected for writing (FIG. 6A), when under a dummy read (i.e., not in the column of the selected cell being written to) (FIG. 6B) and when unselected (FIG. 6C). As shown in FIG. 6A, the Vss node of the cell is set to a positive voltage Vss+ΔV2, while the word line voltage is set to the suppressed voltage level Vdd−ΔV1. For the selected cell, the positive Vss voltage improves the write margin, making the cell easier to flip. When Vss is positive, the room between Vdd and Vss is decreased, reducing the noise margin. During the write operation, transistor M2 in FIG. 6A discharges the internal node "Vdd" through the M2 cell current. Since the suppressed word line voltage (Vdd−ΔV1) is provided at the gate of transistor M2, the cell current is degraded, making the cell more difficult to flip. Increasing Vss to a positive voltage can compensate for the loss in write capability.

For the dummy read cell condition shown in FIG. 6B, the Vss voltage level is set to its normal value, e.g., ground. The suppressed word line voltage improves the cells static noise margin. As discussed above, for the unselected cell, the word line voltage is set to 0V, ensuring the cell sustains its data.

Figure 7:
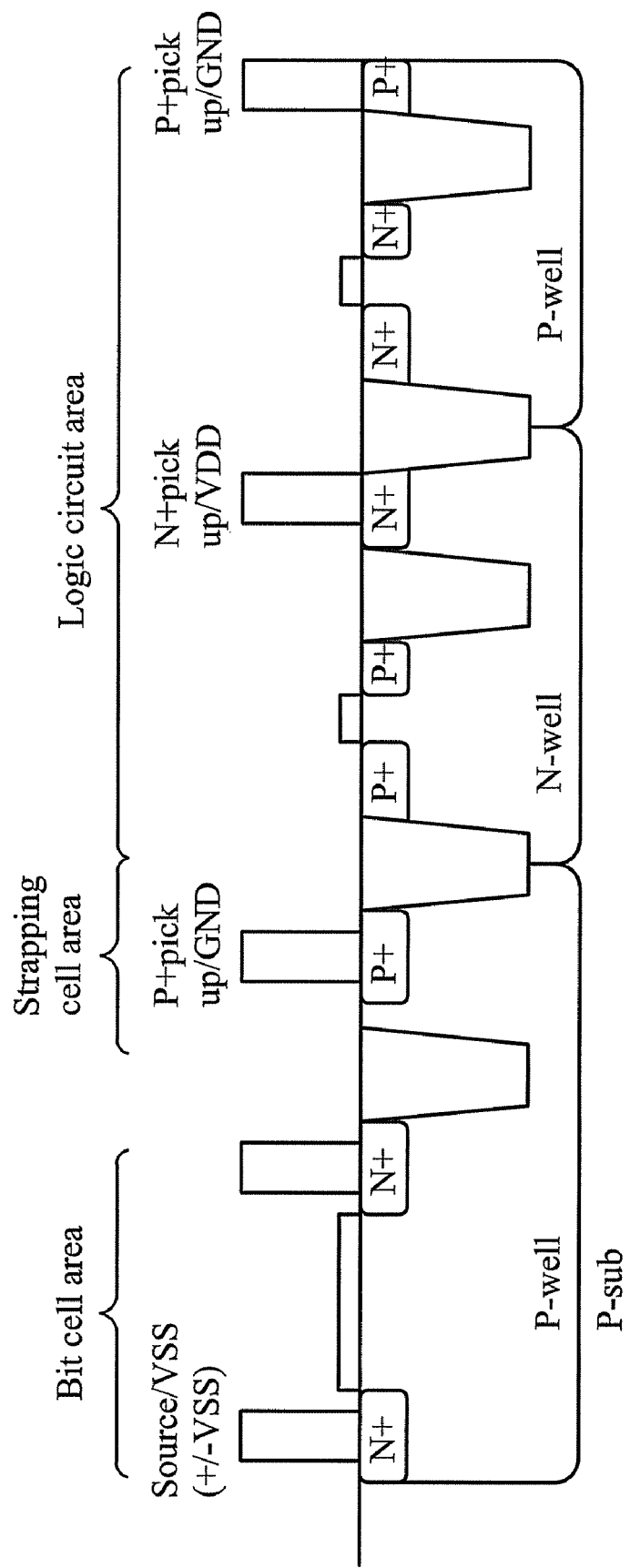
FIG. 7 is a cross-section view showing the SRAM cell and logic area of an exemplary IC memory device.

FIG. 7 is a cross-section view showing the bit cell area, strapping cell area and logic circuit area of an exemplary SRAM memory device. In the SRAM area, the SRAM bit cell layout of a single SRAM cell is very compact. There is no room to pick-up the PMOS or NMOS body. Therefore, a strapping cell is used to pick-up the NMOS or PMOS body to avoid latch-up in the CMOS process. Though normally the source and body of the pull down transistors of the SRAM cell would be connected together, FIG. 7 shows that the negative and positive Vss voltages described above are only introduced into the cell pull-down NMOS transistors' source terminals. This can also be seen in the circuit diagrams of FIGS. 5A, 5C, 6A, and 6C. Since the P-well directly connects to ground, the negative/positive pulse is not introduced into the P-well.

Figure 8:
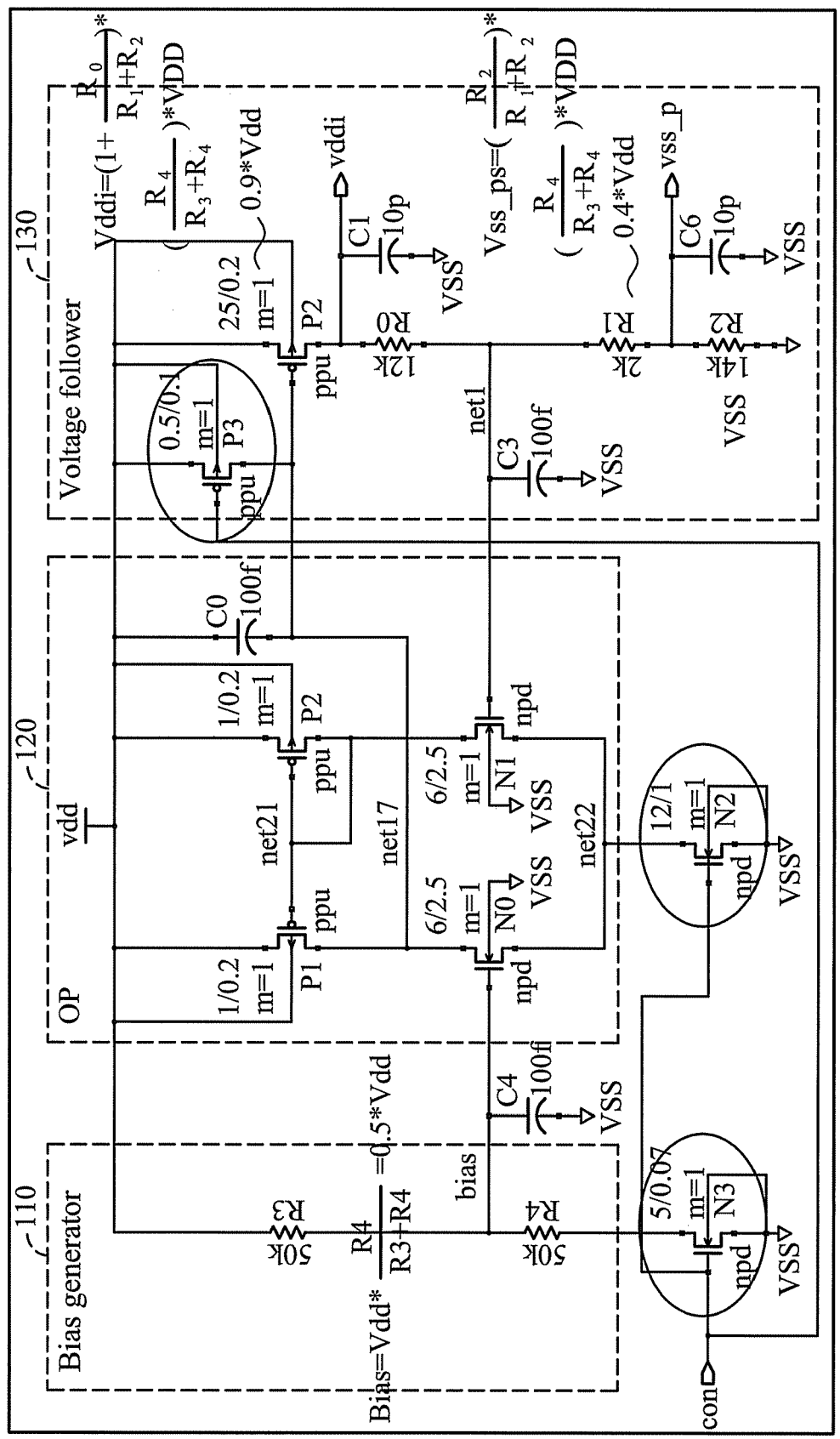
FIG. 8 is a circuit diagram of an embodiment of a circuit for suppressing the word line voltage to the desired level and for providing the positive Vss voltage.

FIG. 8 is a circuit diagram of an embodiment of a circuit 100 for suppressing the word line voltage to the desired level (Vdd−ΔV1) and for providing the positive Vss voltage (Vss+ΔV2). Specifically, the circuit 100 is a voltage down converter which functions to provide a voltage level that is lower than Vdd. The circuit includes a bias generator 110, an operational amplifier 120, and a voltage follower 130. The operational amplifier 120 is used to regulate the vddi and vss_ps voltages outputted by the voltage follower 130. The bias generator 110 is a voltage divider that sets its bias voltage to Vdd*R4/(R3+R4). In one embodiment, the resistance values are selected so that the bias voltage is approximately equal to 0.5*Vdd. This voltage is provided to the operational amplifier 120 to regulate the Vddi voltage to approximately 0.9 Vdd and vss_ps voltage to approximately 0.4*Vdd with the voltage follower. The operational amplifier 120 acts as a comparator to compare the "bias" voltage and feedback voltage "net1." To adjust bias voltage to equal the net1 voltage, the operational amplifier 120 outputs a signal to control the current of PMOS P2 of the voltage follower 130. Through this current adjustment, the net1 voltage is adjusted, thereby adjusting Vddi and Vss_ps. Vddi provides the suppressed word line voltage and vss_ps provide the positive Vss voltage level. When in standby mode (i.e., when the SRAM is not operating), the circuit 100 can shut down, using transistors N3, N2 and P3 as switches to turn off circuits 110, 120 and 130 responsive to control signal CON.

Figure 9:
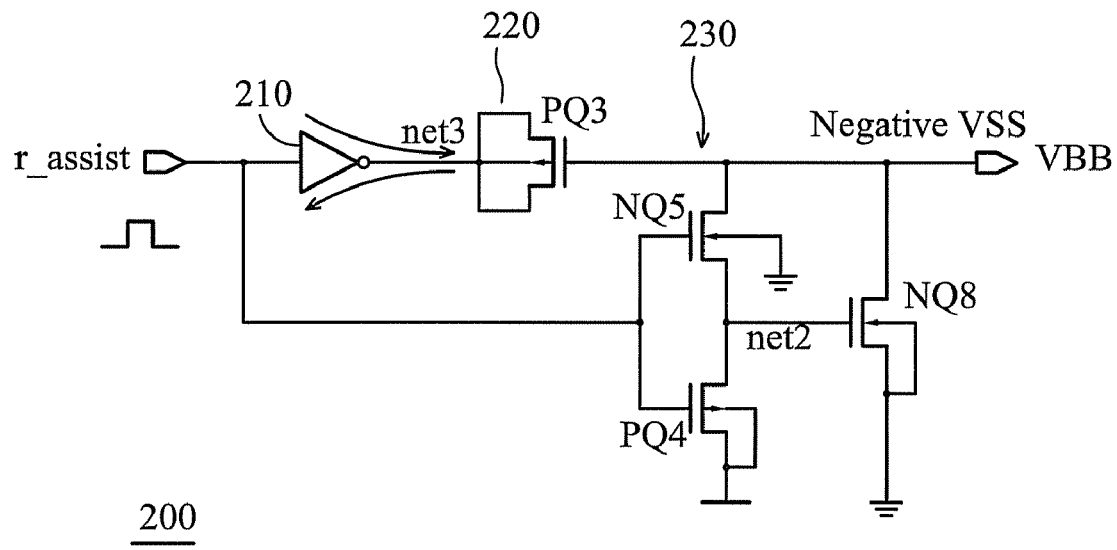
FIG. 9 is a circuit diagram of an embodiment of a circuit for providing a negative Vss voltage.

FIG. 9 is a circuit a circuit diagram of a charged coupled circuit 200 for providing the negative Vss voltage (Vss−ΔV2). The circuit 200 of FIG. 9 is a negative pulse generator. The circuit includes an inverter 210 coupled to an input node. A capacitance circuit 220 including PMOS PQ3 is coupled to the output of the inverter 210. This circuit 220 is used to couple a negative signal to the VBB terminal. As shown in FIG. 9, the source, drain and body of transistor PQ3 are tied together to node net3. When the gate terminal is at ground, the PMOS pQ3 operates in strong inversion, allowing the MOS capacitance to reach its maximum value. A second inverter circuit 230 is coupled between the output node of negative pulse generator circuit 200 and ground, and has an input node coupled to the input node of the negative pulse generator circuit 200. Inverter 230 includes an NMOS NQ5 and a PMOS PQ4 coupled in series. The output of the circuit 230 is coupled to the gate of NMOS NQ8, which is coupled between the output node VBB and ground. The negative Vss voltage is provided at output node VBB. The operation of the circuit 200 is described below.

At time T0, r_assist is "0" and voltage node net2 is a "1". Transistor NQ8 turns on, pushing VBB to ground. At time T1, when r_assist begins to rise to a high. Node net3 is discharged to a low by inverter 210. This couples a negative signal to node VBB. At time T2, when r_assist is high, node net 3 continues to discharge. A leakage path through transistors NQ5 and NQ8 (since VBB is negative) develops and recharges the inverter 210 to raise VBB slightly. At time T3, r_assist begins to drop from high to low. Node net3 is charged rapidly by the inverter to a positive voltage VNN. At time T4, r_assist reaches the low state. Node net2 is again set to "1". NMOS NQ8 discharges VBB from VNN to ground. The desired negative Vss voltage is provided from about time T1 to about time T3.

In an alternative embodiment, the negative VSS generation circuit could be embodied as a charge pump circuit, as will be familiar to those skilled in the art.

Figure 10:
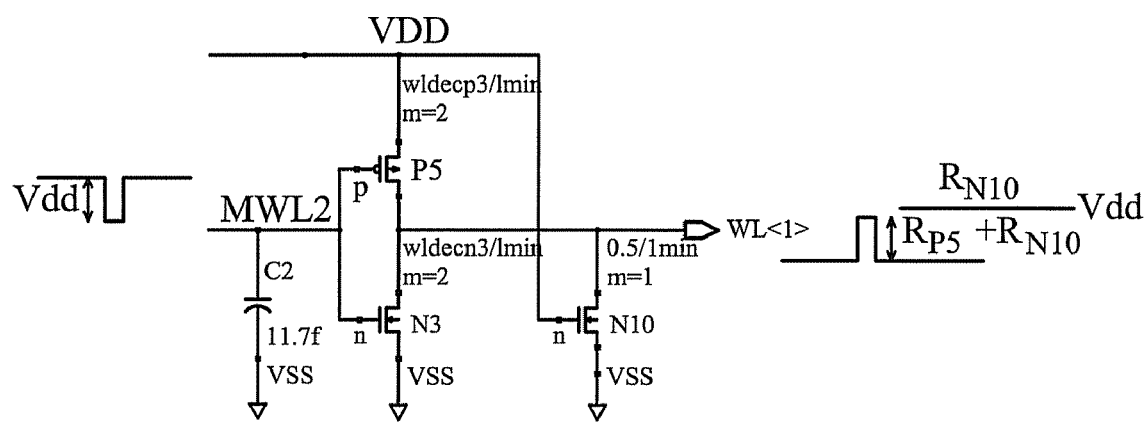
FIG. 10 is a circuit diagram of a voltage divider circuit for providing a negative Vss voltage.

In an alternative embodiment, a voltage divider circuit may be used to provide the suppressed word line voltage. An exemplary voltage divider circuit 300 is shown in FIG. 10. When the word line is turned "on", meaning the main word line voltage MWL falls from Vdd to ground, PMOS P5 is on. Without NMOS N10, the word line level WL<1> is Vdd. NMOS N10 acts as a voltage divider, clamping the voltage level at WL<1> with NMOS N10. The resistance of N10 and P5 controls the voltage level, i.e., the voltage at WL<1> equals $R_{N10}/(R_{P5}+R_{N10})*Vdd$. The ratio of the resistance of N10 and P5 can be adjusted by sizing the device widths and lengths.

Figure 11:
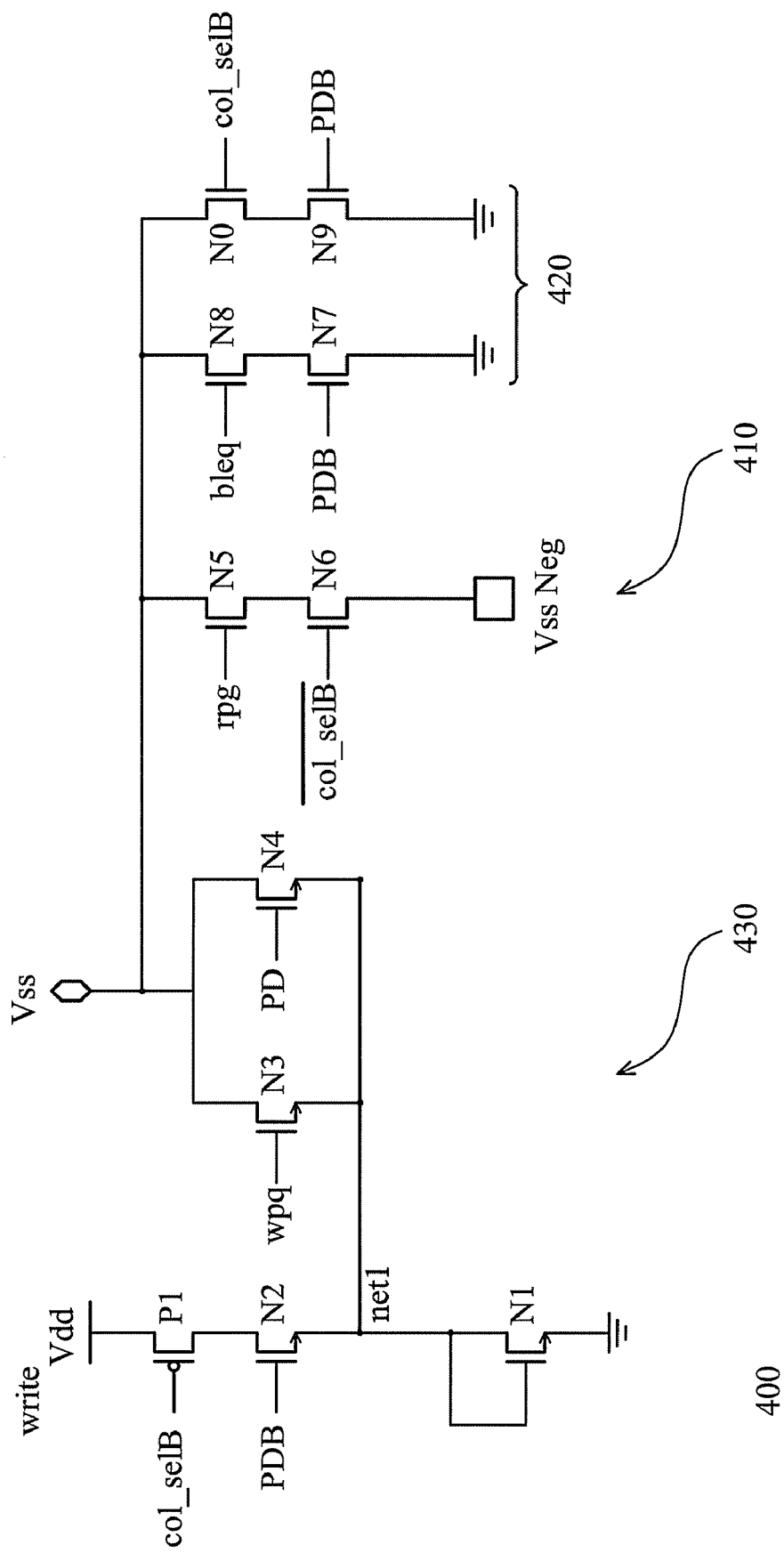
FIG. 11 is a circuit diagram of an alternative embodiment of a circuit for providing a positive Vss voltage.

In yet another embodiment, the Vss multiplexer circuit (FIGS. 1-4) and positive Vss voltage generator can be implemented in the same circuit to provide the positive Vss voltage Vss+ΔV2. This circuit 400 is shown in FIG. 11. One instance of circuit 400 is provided for each column (See FIGS. 2-4) to bias the column's Vss terminal. The circuit 400 includes write-assist and standby control circuit 430, unselected cell control circuit 420 and read-assist circuit 410.

The write-assist and standby control circuit 430 includes a column select PMOS transistor P1 coupled between supply terminal Vdd and drain terminal of NMOS transistor N2. NMOS transistor N2 has a source terminal coupled to node net1. NMOS transistor N1 is coupled as a diode between the ground node and node net1 and has its gate and drain terminals coupled together. The VSS node is coupled to the net1 node by two NMOS transistors N3 and N4. The operation of the circuit is described below.

Signal col_selB is the column select signal and identifies which bit-line will be selected. Signals PD and PDB are power down signals. When PD is high, the chip is in standby mode. When PDB is high, the circuit is in active mode, i.e., read or write mode. Signal wpg is the write pulse signal. When wpg rises to high, the SRAM circuit is in write operation. Signal rpg is the read pulse signal. When rpg rises to high, the SRAM circuit is in read operation.

During write operation, signal col_selB is set to "0" for the selected bit line. PD is also set to "0" and PDB is set to Vdd. Current flows into transistor N1. Since N1 is diode connected, a voltage level at node net1 is set to about 0.25V, which corresponds to the diode drop. When wpg rises to Vdd, the write operation starts. The net1 voltage passes to the VSS node through transistor N3. Transistor N4 is off since PD is set to "0".

In standby mode, the SRAM need only retain the stored data. The only concern in this mode is with circuit leakage current. For standby mode, the PDB signal turns off transistors N2, N6, N7 and N9, since there is no read/write signal. Only transistor N4 can pass array current into transistor N1.

Node net1 is at a positive voltage level since transistor N1 is connected as a diode. The net1 voltage level is passed through N4 to the array Vss node. The positive Vss voltage level can reduce array leakage current. The circuit is thus self-tracking.

As shown in the multiplexer circuit of FIG. 2, a switch can be provided between the Vss node and a circuit that provides the negative Vss voltage, such as the negative pulse generator 200 of FIG. 9 or other appropriate circuit. Read-assist circuit 410 of the circuit 400 of FIG. 11 provides the negative Vss voltage to node Vss during read operations. Circuit 410 includes NMOS transistors N5 and N6 between node Vss and VssNeg. When signal "rpg" and inverted signal col_selB are high, node Vss is coupled to the negative Vss voltage.

Unselected cell control circuit 420 includes first set of NMOS transistors N7 and N8 coupled between node Vss and ground and second set of NMOS transistors N9 and N10 coupled between node Vss and ground. Transistors N7 and N9 are on when signal PDB is high. Transistor N10 is on when signal col_selB is high. Transistor N8 is on when signal "bleq" is high. Signal bleq is the pulsed bit line pre-charge signal and it is a global signal provided to each column of bit lines, whether selected or not. For unselected cells, the column select signal is high. Transistor N10, under control of the column select signal col_selB, is used to connect the Vss node to ground. Using transistors N9 and N10, the short floating time period set by signal bleq for selected bit lines will not impact the unselected cells.

As with the circuit 100 of FIG. 8, in the circuit 400 of FIG. 11 the positive Vss voltage level is tied to Vdd. For example, in FIG. 8, the positive Vss voltage is approximately 0.4 Vdd and in FIG. 11, the diode voltage drop value is dependent on Vdd, as the leakage current flow into N1 depends on Vdd. Therefore, the positive Vss level tracks changes in Vdd. As leakage current depends on the difference between Vdd and Vss (Vdd−Vss), maintaining this difference at a desired level can lower leakage current levels. It is believed that power savings as much as 50% can be achieved.

Further deep submicron SRAMs will continue to operate under low voltage Vdd conditions. By way of example, for 45 nm and beyond devices, the operating Vdd will be 1.1 V±30%, i.e., Vdd will be between about 0.77 V and about 1.43 V. Where Vdd is in this range, Vssc should be up to about 220 mV in order to achieve successful data writing in the cell in the write operation. On the other hand, Vssc should be from about −50 mV to about −100 mV to compensate for the loss of the cell current caused by the suppressed word line voltage in the read operation.

The following table shows exemplary bias conditions for different Vdd voltage values, where "CVdd" is the SRAM bit cell pull up device source terminal voltage. In embodiments, CVdd is equal to Vdd though this is not a requirement. "Vssc" represents the cell area Vss voltage.

As described above, the combination of the suppressed word line voltage and negative Vss during read operations improves the read cell stability of the dummy cells. During write operation, the combination of the suppressed word line voltage and positive Vss voltage improves the write capability. In summary, random single-bit failures of the memory array are reduced, due to the improvement in read stability and write margin. This improved biasing can be used for both dual port and single port SRAM cells.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A memory device, comprising:
a plurality of SRAM cells arranged in a matrix having a plurality of rows and a plurality of columns, wherein each cell is capable of storing a bit, each cell coupled between a first power supply node for receiving a cell power supply voltage and a second power supply node for selectively receiving one of a negative read voltage, a positive write voltage and a ground voltage, and a plurality of word lines supplied by a word line voltage, wherein said word line voltage is a suppressed power supply voltage for a word line coupled to a cell selected for a read or write operation; and
a switch circuit coupled to the second power supply node of each cell, said switch circuit selectively coupling either the positive write voltage or the negative read voltage to the second power supply node of cells in a column of cells containing the selected cell, and simultaneously coupling the ground voltage to the second power supply node of cells in columns of cells sharing the word line coupled to the selected cell.

2. The memory of claim 1, further comprising means for providing said negative read voltage.

3. The memory of claim 2, wherein said providing means is negative pulse generator.

4. The memory of claim 1, further comprising means for providing said positive write voltage.

5. The memory of claim 4, wherein said providing means comprises a voltage divider.

6. The memory of claim 4, wherein said providing means comprises a bias generator coupled to an input of an operational amplifier and a voltage follower circuit coupled to an output of said operational amplifier.

7. The memory of claim 6, wherein said providing means also provides said suppressed power supply voltage.

8. The memory of claim 4, wherein said providing means comprises a diode coupled between said second power supply node and ground.

9. The memory of claim 1, further comprising means for providing said word line voltage.

|  | CVdd | Vssc (when Vdd = 0.8 V) | Vssc (when Vdd = 1.0 V) | Vssc (when Vdd = 1.5 V) | Word line voltage level |
|---|---|---|---|---|---|
| Read | CVdd | Vss − 50 mv ± 10 mv | Vss − 80 mv ± 10 mv | Vss − 100 mv ± 10 mv | 90% Vdd ± 3% Vdd |
| Write | CVdd | Vss + 200 mv ± 50 mv | Vss + 350 mv ± 50 mv | Vss + 450 mv ± 50 mv | 90% Vdd ± 3% Vdd |
| Standby | CVdd | Vss + 200 mv ± 50 mv | Vss + 200 mv ± 50 mv | Vss + 200 mv ± 50 mv | GND |

10. A method of operating a SRAM memory array, the SRAM memory array comprising a plurality of SRAM cells arranged in a matrix having a plurality of rows and a plurality of columns, wherein each cell is capable of storing a bit, each cell being coupled between a first power supply node for receiving a cell power supply voltage and a second power supply node, comprising the following steps:

activating a first wordline coupled to a memory cell selected for a read or write operation, said first wordline being biased at a suppressed voltage level less than a power supply voltage Vdd;

coupling either a positive write voltage or a negative read voltage to the second power supply node of cells in a column of cells containing the selected memory cell; and simultaneously coupling a ground voltage to the second power supply node of cells in columns of cells sharing the first word line with the selected cell.

11. The method of claim 10, further comprising the step of applying a positive voltage to the second power supply node of memory cells when said SRAM memory array is in standby mode.

12. The method of claim 10, wherein the power supply voltage Vdd is between about 0.8 to 1.5 V, and wherein the positive write voltage is greater than or equal to about 200 mV.

13. The method of claim 10, wherein the power supply voltage Vdd is between about 0.8 to 1.5 V, and wherein the negative read voltage is between about −50 mV and about −100 mV.

* * * * *